(12) United States Patent
Zackrisson et al.

(10) Patent No.: US 7,985,471 B2
(45) Date of Patent: Jul. 26, 2011

(54) COATED CUTTING TOOL

(75) Inventors: Jenni Zackrisson, Fagersta (SE); Silvia Dahlund, Soderbarke (SE); Tommy Larsson, Angelsberg (SE)

(73) Assignee: Seco Tools AB, Fagersta (SE)

( * ) Notice: Subject to any disclaimer, the term of this patent is extended or adjusted under 35 U.S.C. 154(b) by 290 days.

(21) Appl. No.: 12/168,490

(22) Filed: Jul. 7, 2008

(65) Prior Publication Data

US 2009/0017289 A1 Jan. 15, 2009

(30) Foreign Application Priority Data

Jul. 13, 2007 (SE) ...................................... 0701703

(51) Int. Cl.
*B23B 27/14* (2006.01)

(52) U.S. Cl. ............ 428/336; 51/307; 51/309; 428/216; 428/472; 428/697; 428/698; 428/699; 428/701; 428/702

(58) Field of Classification Search .................... 51/307, 51/309; 428/216, 336, 472, 697, 698, 699, 428/701, 702

See application file for complete search history.

(56) References Cited

U.S. PATENT DOCUMENTS

| | | | |
|---|---|---|---|
| 4,277,283 A | 7/1981 | Tobioka et al. .................. 75/238 |
| 4,548,786 A | 10/1985 | Yohe ................................ 419/29 |
| 4,610,931 A | 9/1986 | Nemeth et al. ................. 428/547 |
| 5,250,367 A * | 10/1993 | Santhanam et al. ........... 428/698 |
| 5,654,035 A | 8/1997 | Ljungberg et al. ......... 427/255.3 |
| 5,863,640 A | 1/1999 | Ljungberg et al. ............ 428/216 |
| 5,980,988 A | 11/1999 | Ljungberg ............... 427/255.19 |
| 6,333,100 B1 * | 12/2001 | Palmqvist et al. ............. 428/701 |
| 6,333,103 B1 | 12/2001 | Ishii et al. ..................... 428/325 |
| 6,733,874 B2 * | 5/2004 | Ueda et al. ..................... 428/216 |
| 7,011,867 B2 | 3/2006 | Märtensson ............. 427/255.34 |
| 7,094,447 B2 | 8/2006 | Ruppi ......................... 427/419.7 |
| 7,097,901 B2 * | 8/2006 | Larsson et al. ................. 428/472 |
| 7,132,153 B2 * | 11/2006 | Zackrisson et al. ............ 428/336 |

(Continued)

FOREIGN PATENT DOCUMENTS

EP 1 479 791 A2 11/2004

(Continued)

OTHER PUBLICATIONS

Osada et al., "Wear Mechanism of Thermally Transformed CVD Al2O3 Layer", International Journal of Refractory Metals and Hard Materials, Sep. 2006, p. 387-391, vol. 24, No. 5, XP005445838.

(Continued)

*Primary Examiner* — Archene Turner

(74) *Attorney, Agent, or Firm* — Young & Thompson

(57) ABSTRACT

The present invention concerns a cutting tool insert for turning of steel at high cutting speeds. The cutting tool insert comprises a (006) textured $\alpha$-$Al_2O_3$ coated cemented carbide grade. The cemented carbide body has about 4.5-6.5 wt-% Co and about 3-10 wt-% cubic carbide forming metals and an S-value of about 0.77-0.92 and a coercivity of about 10-20 kA/m. The $\alpha$-$Al_2O_3$ layer has a thickness ranging from about 7 to 12 μm and is composed of columnar grains having a length/width ratio from about 2 to 12 and is deposited on an MTCVD Ti(C,N) layer having a thickness from about 4 to 12 μm. The alumina layer is characterized by a pronounced (006) growth texture. The alumina layer is the uppermost layer and is wet-blasted having an $R_a$ value of less than 1 μm, giving the tool a black and shiny appearance.

23 Claims, 1 Drawing Sheet

U.S. PATENT DOCUMENTS

| | | | |
|---|---|---|---|
| 2004/0224160 A1 | 11/2004 | Ueda et al. | 428/408 |
| 2006/0141271 A1 | 6/2006 | Ruppi | 428/457 |
| 2006/0199026 A1 | 9/2006 | Ruppi | 428/472 |
| 2007/0104945 A1 | 5/2007 | Ruppi | 428/337 |

FOREIGN PATENT DOCUMENTS

| | | |
|---|---|---|
| EP | 1788123 | 5/2007 |
| EP | 1 953 258 A1 | 8/2008 |
| JP | 2004-299021 * | 10/2004 |
| WO | 2006080889 | 8/2006 |
| WO | 2008/094104 A1 | 8/2008 |
| WO | 2008/094105 A1 | 8/2008 |

OTHER PUBLICATIONS

EP Search Report dated Sep. 30, 2008 from EP08159473.

* cited by examiner

COATED CUTTING TOOL

CROSS REFERENCE TO RELATED APPLICATIONS

This application claims priority to Swedish Application No. 0701703-1 filed Jul. 13, 2007, the entire disclosure of which is incorporated herein by reference.

FIELD OF THE INVENTION

The present invention relates to coated cutting tool inserts, which are particularly useful for turning of steel, preferably at high cutting speeds. More specifically, the present invention relates to a substrate, which is cemented carbide, onto which a hard and wear resistant coating is deposited. The coating, which exhibits an excellent adhesion to the substrate covering all functional parts thereof, has one or more refractory layers of which at least one layer is a textured alpha-alumina ($\alpha$-$Al_2O_3$).

BACKGROUND OF THE INVENTION

The control of the $\alpha$-$Al_2O_3$ polymorph in industrial scale was achieved in the beginning of the 1990's with commercial products based on U.S. Pat. No. 5,137,774. Later modifications of this patent have been used to deposit $\alpha$-$Al_2O_3$ with preferred coating textures, described in U.S. Pat. No. 5,654,035, U.S. Pat. No. 5,980,988, U.S. Pat. No. 5,863,640, U.S. Pat. No. 6,333,103, U.S. Pat. No. 7,011,867, U.S. Pat. No. 7,094,447, US-A-2006/0199026, and US-A-2006/0141271.

US-A-2007/0104945 relates to a coated cutting tool insert comprising a substrate and a coating to be used in metal machining. The coating contains one or more refractory layers of which at least one layer is $\alpha$-$Al_2O_3$ and contains columnar grains. The layer is characterized by a strong (006) diffraction peak, measured using XRD, and by low intensity of (012), (104), (113), (024), and (116) diffraction peaks.

U.S. Pat. No. 7,201,956 discloses a cutting tool composed of tungsten carbide-based cemented carbide or titanium carbonitride-based cermet, and a hard coating layer provided on the surface thereof, wherein the hard coating layer includes an aluminum oxide layer having an alpha crystal structure, with the highest peak in the inclination section of the (0001) plane of crystal grains within ten degrees relative to the normal of the surface.

Methods to produce binder phase enriched surface zones on cemented carbides containing tungsten carbide (WC), binder phase, and cubic carbide phase are known, e.g. through Tobioka (U.S. Pat. No. 4,277,283), Nemeth (U.S. Pat. No. 4,610,931) and Yohe (U.S. Pat. No. 4,548,786). The patents by Tobioka, Nemeth and Yohe describe methods to accomplish binder phase enrichment in the surface region by dissolution of the cubic carbide phase close to the insert surfaces. Their methods require that the cubic carbide phase contains some nitrogen, since dissolution of cubic carbide phase at the sintering temperature requires a partial pressure of nitrogen, nitrogen activity, within the body being sintered exceeding the partial pressure of nitrogen within the sintering atmosphere. The nitrogen can be added through the furnace atmosphere during the sintering cycle and/or directly through the powder. The dissolution of cubic carbide phase, preferentially in the surface region, results in small volumes that will be filled with binder phase giving the desired binder phase enrichment. As a result, a surface zone consisting of essentially WC and binder phase is obtained. Although the cubic carbide phase is essentially a carbonitride phase, the material is herein referred to as a cemented carbide.

When cemented carbide cutting tools are used in the machining of steels, the tool is worn by different mechanisms, such as abrasive and chemical wear, chipping, and fracturing of the cutting edge. For a coated tool normally having thin surface layers of wear resistant carbide, nitride, carbonitride and/or oxide compounds formed by various vapor deposition techniques, the coating contributes to increase the abrasive wear resistance, but it also acts as a thermal barrier for the diffusion of heat from the cutting surface into the underlying cemented carbide substrate. A high temperature within the edge region in combination with high cutting forces result in an increase of the creep deformation within the affected surface region of the substrate and the cutting edge deforms plastically. Inserts for machining of steel must have good deformation resistance, wear resistance, and toughness.

What is needed is a cutting tool insert with good deformation resistance, wear resistance, and toughness that is useful for machining of iron-based alloys, preferably turning of steel, at fine, medium, rough and interrupted cutting conditions at high cutting speeds. The invention is directed to these, as well as other, important needs.

SUMMARY OF THE INVENTION

In one aspect, the invention is directed to cutting tool inserts, comprising a cemented carbide body and a coating,
wherein the cemented carbide body comprises:
WC,
about 4.5-6.5 wt-% Co; and
about 3-10 wt-% of at least one cubic carbide forming metal selected from the group consisting of groups IVb, Vb and VIb of the periodic table;
wherein the cemented carbide body has an S-value of about 0.77-0.92 and a coercivity of about 10-20 kA/m adjacent;
wherein the coating comprises an uppermost layer,
wherein the uppermost layer is about 7-12 µm thick;
wherein the uppermost layer comprises an $\alpha$-$Al_2O_3$ layer textured in the <006>-directions with a texture coefficient TC(006) greater than about 2, TC(012), TC(110), TC(113), TC(202), TC(024) and TC(116) are simultaneously all less than about 1, and TC(104) being the second highest texture coefficient, the texture coefficient TC(hkl) being defined by:

$$TC(hkl) = \frac{I(hkl)}{I_0(hkl)} \left[ \frac{1}{n} \sum_{n=1}^{n} \frac{I(hkl)}{I_0(hkl)} \right]^{-1}$$

where
I(hkl)=measured intensity of the (hkl) reflection.
Io(hkl)=standard intensity according to JCPDS card no 46-1212.
n=number of reflections used in the calculation (8).
(hkl) reflections used are: (012), (104), (110), (006), (113), (202), (024) and (116).

In another aspect, the invention is directed to methods for high-speed turning of a metal, comprising the step of using a cutting tool insert described herein, especially in iron-based alloys, including toughness and wear resistance demanding operations in steel.

BRIEF DESCRIPTION OF THE DRAWINGS

The accompanying drawings, which are included to provide a further understanding of the invention and are incor

DETAILED DESCRIPTION OF THE INVENTION

Figure 1:
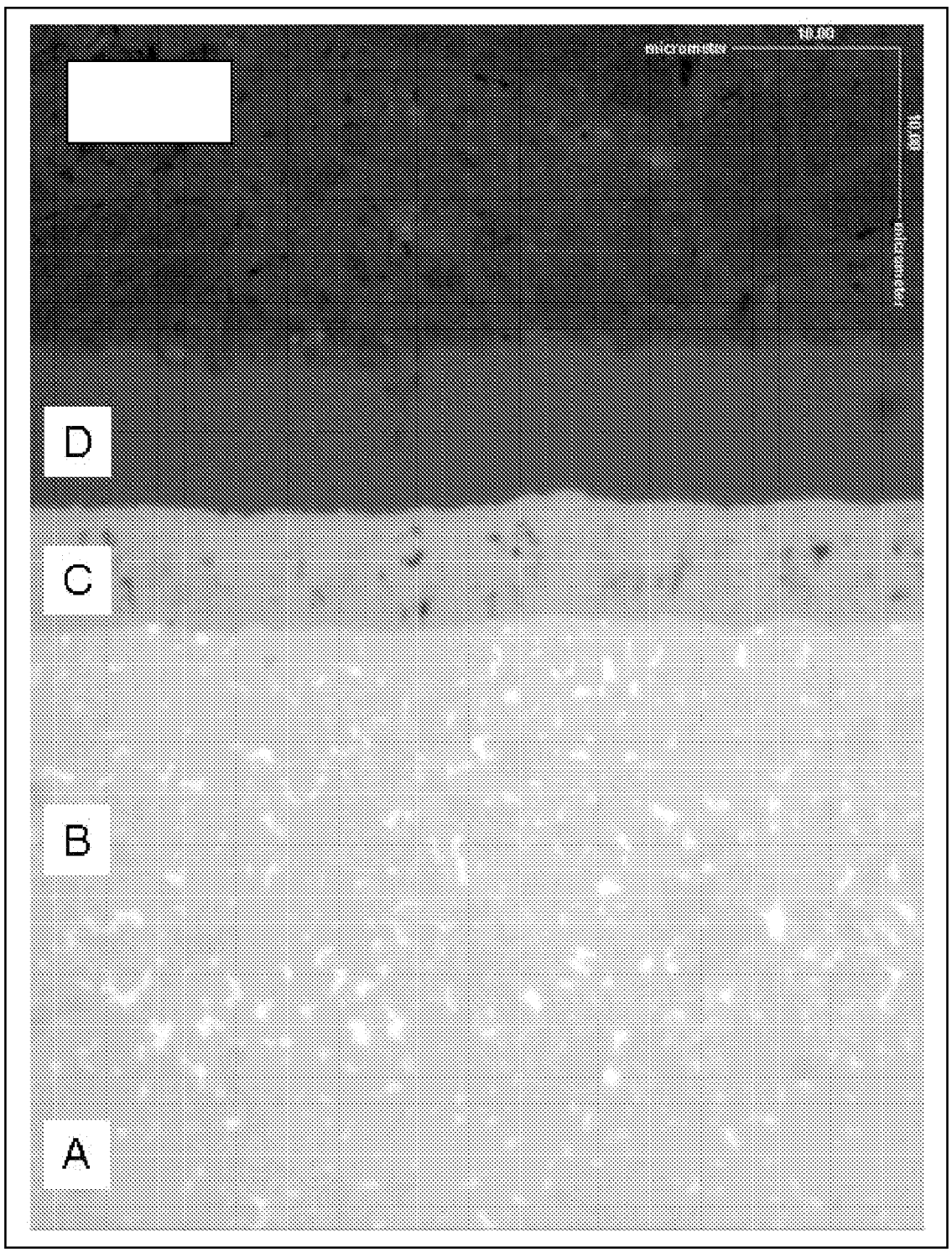
- FIG. 1 shows a cross sectional light optical microscope picture of a coated insert according to the invention:
A interior of the substrate
B binder phase enriched zone
C titanium carbonitride layer
D alumina layer

According to the present invention it has now surprisingly been found that a cemented carbide with a cobalt (Co)-enriched surface zone provided with a coating comprising a (006) textured alumina layer post treated by wet blasting is suitable for high-speed machining applications, preferably in iron based alloys, most preferably in toughness and wear resistance demanding operations in steel. The working area is continuous and interrupted turning at high speed with and without coolant along with finishing operations with high demands on wear resistance, toughness, and on precision and surface finish and for machining of stainless steel where the common problem with built up edge on the cutting tool is reduced and the surface finish of the work piece is improved. This surprising improvement can be explained by the combined effect of cemented carbide with a Co-enriched surface zone, with a (006) textured alumina and post treatment, preferably wet blasting of the insert.

According to the present invention a coated cutting tool insert is provided consisting of a cemented carbide body with a composition of about 4.5-6.5 wt-%, preferably about 5-6 wt-% Co, and about 3-10 wt-% cubic carbide forming metals from groups WVb, Vb and VIb of the periodic table, preferably Ti, Nb and Ta, and balance WC. The ratio between the weight concentrations of Ta and Nb is within about 1.0-3.0, preferably about 1.5-2.5. The ratio between the weight concentrations of Ti and Nb is within about 0.5-1.5, preferably about 0.8-1.2.

The cobalt binder phase is highly alloyed with tungsten. The concentration of W in the binder phase may be expressed as the S-value=$\sigma/16.1$, where $\sigma$ is the magnetic moment of the binder phase in $\mu Tm^3\ kg^{-1}$. The S-value depends on the content of tungsten in the binder phase and increases with decreasing tungsten content. Thus, for pure cobalt, or a binder that is saturated with carbon, S=1 and for a binder phase that contains W in an amount that corresponds to the borderline to formation of η-phase, S=0.78. It has now been found according to the present invention that improved cutting performance is achieved if the cemented carbide body has an S-value within the range about 0.77-0.92, preferably about 0.79-0.89. The mean grain size of the carbide phases may be expressed as the coercivity of the cemented carbide. According to the present invention, it has been found that a coercivity within about 10 to 20 kA/m, preferably within about 13 to 17 kA/m, results in improved cutting performance.

In a first preferred embodiment the cemented carbide comprises about 6-10, preferably about 7-8, wt-% cubic carbide forming metals from groups IVb, Vb and VIb of the periodic table, preferably Ti, Nb and Ta.

In a second preferred embodiment the cemented carbide comprises about 3-6, preferably about 3-5, wt-% cubic carbide forming metals from groups IVb, Vb and VIb of the periodic table, preferably Ti, Nb and Ta.

In a third preferred embodiment at least one surface of the cemented carbide body discussed above is provided with an about 5-40 µm thick, preferably about 5-30 µm thick, most preferably about 10-25 µm thick, essentially cubic carbide phase free and binder phase enriched surface zone with an average binder phase content in the range about 1.2-2.5 times the nominal binder phase content.

The coating comprises a medium temperature chemical vapor deposition (MTCVD)-layer as the first layer adjacent the substrate having a thickness of from about 4 to 12 µm, preferably from about 5 to 10 µm. On top of the MTCVD layer an α-$Al_2O_3$ layer is deposited. The MTCVD-layer contains an innermost TiN layer of < about 3, preferably about 0.5-2 µm adjacent to the substrate with a Ti(C,N) layer on top. Preferably, there is also an additional TiN layer inserted in the Ti(C,N) layer having a thickness of about 0.5-3 µm, preferably about 1.0-2.0 µm. The TiN layer is placed in the Ti(C,N) layer about 0.5-2.5 µm below the alumina layer. The first MTCVD Ti(C,N) layer adjacent the substrate can be substituted by MTCVD Ti(C,O,N), CVD Ti(C,N), CVD TiN, CVD TiC, MTCVD Zr(C,N), or combinations thereof.

The α-$Al_2O_3$ layer according to the invention consists of nucleated α-$Al_2O_3$ with columnar grains with low dislocation density, essentially free from transformation stresses. The thickness of the alumina layer is from about 7 to 12 µm, preferably about 8 to 11 µm. The alumina layer is composed of columnar grains with (006) texture, having a length/width ratio of from about 2 to 12, preferably about 4 to 8. The α-$Al_2O_3$ layer is the uppermost layer. Typically, the surface roughness is Ra< about 1.0 µm, preferably about 0.3-0.7 µm.

The texture coefficients (TC) for the α-$Al_2O_3$ layer is determined as follows:

$$TC(hkl) = \frac{I(hkl)}{I_0(hkl)}\left[\frac{1}{n}\sum_{n=1}^{n}\frac{I(hkl)}{I_0(hkl)}\right]^{-1}$$

where
I(hkl)=intensity of the (hkl) reflection
Io(hkl)=standard intensity according to JCPDS card no 46-1212
n=number of reflections used in the calculation. (hkl) reflections used are: (012), (104), (110), (006), (113), (202), (024) and (116).

The texture of the alumina layer is as follows:
TC(006)>about 2, preferably >about 3 and <about 6, and preferably <about 5. Simultaneously, TC(012), TC(110), TC(113), TC(202), TC(024) and TC(116) are all <about 1 and TC(104) is the second highest texture coefficient.

In a preferred embodiment TC(104)<about 2 and >about 0.5. The total coating thickness is between about 11 and 24 µm, preferably between about 13 and 21 µm.

The invention also relates to methods of making cutting tool inserts according to the description comprising a cemented carbide substrate consisting of a binder phase of Co, WC and a cubic carbonitride phase with a binder phase enriched surface zone essentially free of cubic carbide phase and a coating. A powder mixture containing about 4.5-6.5 wt-%, preferably about 5-6 wt-% Co, and about 3-10 wt-% cubic carbide forming metals from groups IVb, Vb and VIb of the periodic table, preferably Ti, Nb and Ta, and balance WC is prepared. The ratio between the weight concentrations of Ta and Nb is within about 1.0-3.0, preferably about 1.5-2.5. The ratio between the weight concentrations of Ti and Nb is within about 0.5-1.5, preferably about 0.8-1.2. The raw materials are mixed with pressing agent. W is added when the raw materials contain too much C to obtain the desired S-value. In the opposite case, when the carbon content is too low in the raw material mixture, pure carbon is added. In this way, the desired S-value is obtained and the mixture is milled and spray dried to obtain a powder material with the desired properties. Next, the powder is compacted and sintered. Sintering is performed at a temperature of about 1300-1500° C. in a controlled atmosphere of about 50 mbar followed by cooling.

In one embodiment, well-controlled amounts of nitrogen are added through the powder e.g. as nitrides or by performing an in-situ nitriding in the furnace using e.g. nitrogen gas. The optimum amount of nitrogen to be added depends on the composition of the cemented carbide and in particular on the amount of cubic phases. The exact conditions depend to a certain extent on the design of the sintering equipment being used. It is within the purview of the skilled artisan to determine and to modify the nitrogen addition and the sintering process in accordance with the present specification in order to obtain the desired results.

The cemented carbide surface is coated with a Ti(C,N) layer and possibly intermediate layers by chemical vapor deposition (CVD) and/or MTCVD. Subsequently, a CVD process incorporating several different deposition steps, is used to nucleate $\alpha\text{-}Al_2O_3$ at a temperature of about 1000° C. In these steps the composition of a $CO_2+CO+H_2+N_2$ gas mixture is controlled to result in an O-potential required to achieve (006) texture. The $\alpha\text{-}Al_2O_3$-layer is then deposited by conventional CVD at 1000° C. The exact conditions depend on the design of the coating equipment being used. It is within the purview of the skilled artisan to determine the gas mixture in accordance with the present invention.

Finally, the $\alpha\text{-}Al_2O_3$ is post treated with a surface polishing method, preferably wet-blasting, in order to decrease the surface roughness.

The present invention also relates to the use of a cutting tool insert according to the above in continuous fine, medium, rough and interrupted turning of steel at high speed with and without coolant along with finishing operations with high demands on wear resistance, toughness and on precision and surface finish. The present invention also relates to the use of a cutting tool according to above for machining of stainless steel where the common problem with built up edge on the cutting tool is reduced and the surface finish of the work piece is improved.

Unless defined otherwise, all technical and scientific terms used herein have the same meaning as commonly understood by one of ordinary skill in the art to which this invention belongs. Although any methods and materials similar or equivalent to those described herein can be used in the practice or testing of the present invention, the preferred methods and materials are now described. All publications mentioned hereunder are incorporated herein by reference. Unless mentioned otherwise, the techniques employed or contemplated herein are standard methodologies well known to one of ordinary skill in the art. The materials, methods, and examples are illustrative only and not limiting.

The present invention is further defined in the following Examples, in which all parts and percentages are by weight and degrees are Celsius, unless otherwise stated. It should be understood that these examples, while indicating preferred embodiments of the invention, are given by way of illustration only. From the above discussion and these examples, one skilled in the art can ascertain the essential characteristics of this invention, and without departing from the spirit and scope thereof, can make various changes and modifications of the invention to adapt it to various usages and conditions.

Example 1

Cemented Carbide Inserts

Cemented carbide inserts of type CNMG120408, CCMT09T308 and TPUN160308 were produced according to the invention by conventional milling of the raw material powders, pressing of the green compacts and subsequent sintering at 1430° C. The inserts were also subjected to traditional edge preparation and dimensional grinding. Data for the inserts after sintering is shown in Table 1.

TABLE 1

Compositions and Physical Data

| Substrate | Co, wt-% | Ta, wt-% | Nb, wt-% | Ti, wt-% | Coercivity, kA/m | S-value | Gradient, μm |
|---|---|---|---|---|---|---|---|
| A | 5.5 | 3.2 | 2.0 | 2.3 | 13.5 | 0.85 | 15 |
| B | 5.8 | 3.2 | 2.0 | 2.3 | 15 | 0.84 | 14 |
| C | 5.1 | 3.2 | 2.0 | 2.3 | 14 | 0.87 | 12 |

Example 2

Coatings

Inserts from Example 1 were MTCVD and CVD Coated.

The first layer was Ti(C,N) deposited by MTCVD using acetonitrile as a carbon/nitrogen source. In the following steps an alumina layer was deposited and the composition of $CO_2+CO+H_2+N_2$ gas mixture was controlled to achieve (006) texture. The thickness of the different layers was controlled by the deposition time. The thickness and texture coefficients for layers are shown in table 2.

TABLE 2

Thickness and texture coefficients of the layers

| Coating | TiCN, μm | $\alpha\text{-}Al_2O_3$, μm | TC (012) | TC (104) | TC (110) | TC (006) | TC (113) | TC (202) | TC (024) | TC (116) |
|---|---|---|---|---|---|---|---|---|---|---|
| A | 8 | 10 | 0.20 | 1.12 | 0.13 | 5.72 | 0.12 | 0.09 | 0.14 | 0.47 |
| B | 6 | 8.5 | 0.31 | 1.52 | 0.13 | 4.70 | 0.17 | 0.20 | 0.20 | 0.77 |

Example 3

Inserts from Example 1 and Example 2 and a competitor grade (comparative) relevant to the application area were tested with respect to deformation resistance.

| | |
|---|---|
| Work piece | Cylindrical bar |
| Material | Ck45 |
| Insert type | TPUN160308 |
| Cutting speed | 900 m/min |
| Feed | 0.3 mm/rev |
| Depth of cut | 3.0 mm |
| Remarks | dry turning |

The inserts were inspected after 25 seconds of cutting. Table 3 shows the degree of deformation in arbitrary units of the cutting edge.

TABLE 3

Deformation of the cutting edge after 25 seconds in cut

| Sample | Degree of deformation, arbitrary units. |
|---|---|
| Invention: Substrate B + Coating A | 0.10 |
| Invention: Substrate B + Coating B | 0.12 |
| Comparative: Competitor grade W | 0.28 |

Example 4

Inserts from Example 1 and Example 2 and competitor grades (comparative) relevant to the application area were tested with respect to tool life.

| | |
|---|---|
| Work piece | Cylindrical bar |
| Material | Ck45 |
| Insert type | CNMG120408 |
| Cutting speed | 400 m/min |
| Feed | 0.45 mm/rev |
| Depth of cut | 2.0 mm |
| Remarks | Coolant |

Measurements of wear, vbb in mm after 12 minutes time in cut are shown in Table 4.

TABLE 4

Wear measurements after 12 minutes time in cut

| Sample: | Wear, vbb |
|---|---|
| Invention: Substrate A + Coating A | 0.18 mm |
| Invention: Substrate B + Coating A | 0.15 mm |
| Comparative: Competitor grade X | >1.0 mm (edge break down) |
| Comparative: Competitor grade Y | >1.0 mm (edge break down) |
| Comparative: Competitor grade Z | 0.27 mm |
| Comparative: Competitor grade W | 0.38 mm |

Example 5

Inserts from Example 1 and Example 2 and a competitor grade (comparative) relevant to the application area were tested in a finishing operation where the machining mode was facing.

| | |
|---|---|
| Work piece | Cylindrical bar, diameter 80 mm. |
| Material | 100Cr6 |
| Insert type | CCMT09T308-F1 |
| Cutting speed | 250 m/min (with coolant) |
| Feed | 0.15 mm/rev |
| Depth of cut | 1.5 mm |

The result expressed as wear after 40 facings are presented in Table 5.

TABLE 5

Wear after 40 facings.

| Sample | Wear (vbb in mm) after 40 facings |
|---|---|
| Invention: Substrate B + Coating B | 0.09 |
| Invention: Substrate C + Coating B | 0.08 |
| Comparative: Competitor grade X | 0.16 |

Example 6

Inserts from Example 1 and Example 2 and competitor grades (comparative) relevant to the application area were tested with respect to toughness in longitudinal turning with interrupted cuts.

| | |
|---|---|
| Work piece | Cylindrical bar diameter 160 mm, with four axial grooves |
| Material | Ck45 |
| Insert type | TPUN160308 |
| Cutting speed | 120 m/min |
| Feed | 0.1, 0.12, 0.16, 0.20, 0.25, 0.32 mm/rev gradually increased after 10 mm length of cut |
| Depth of cut | 2.0 mm |
| Remarks | dry turning |

Tool life criteria: Gradually increased feed until edge chipping occurs. 9 edges of each variant were tested. The test results in Table 6 show that a product according to the present invention has increased edge toughness compared to the comparative examples.

TABLE 6

Average feed when edge chipping occurs, mean value for 9 edges.

| Sample | Mean feed rate at breakage (mm/rev) |
|---|---|
| Invention substrate A+ Coating B | 0.21 |
| Invention substrate C+ Coating A | 0.19 |
| Comparative: Competitor grade Y | 0.17 |
| Comparative: Competitor grade W | 0.16 |
| Comparative: Competitor grade V | 0.16 |

Example 7

Inserts from Example 1 and Example 2 and competitor grades (comparative) relevant to the application area were tested in a finishing operation in stainless steel. The operation mode was facing of small diameter bars.

| | |
|---|---|
| Work piece | Cylindrical bar, diameter 55 mm, length 178 mm |
| Material | 316L |
| Insert type | CCMT09T308-F1 |
| Cutting speed | 120 m/min (with coolant) |

-continued

| Feed | 0.25 mm/rev |
| --- | --- |
| Depth of cut | 0.8 mm |

Tool life criteria were flank wear or notch wear>0.15 mm
The number of facings performed before end of tool life is shown in Table 7 below.

TABLE 7

Number of facings performed and corresponding wear measurements

| Sample: | No. of facings | Wear, mm |
| --- | --- | --- |
| Invention: Substrate A + Coating A | 33 | 0.15 (flank) |
| Invention: Substrate C + Coating B | 39 | 0.17 (notch) |
| Comparative: Competitor grade X | 21 | 0.23 (notch) |
| Comparative: Competitor grade Y | 11 | 0.15 (flank) |
| Comparative: Competitor grade W | 18 | 0.17 (flank) |

When ranges are used herein for physical properties, such as molecular weight, or chemical properties, such as chemical formulae, all combinations and subcombinations of ranges specific embodiments therein are intended to be included.

The disclosures of each patent, patent application, and publication cited or described in this document are hereby incorporated herein by reference, in their entirety.

Those skilled in the art will appreciate that numerous changes and modifications can be made to the preferred embodiments of the invention and that such changes and modifications can be made without departing from the spirit of the invention. It is, therefore, intended that the appended claims cover all such equivalent variations as fall within the true spirit and scope of the invention.

What is claimed is:

1. A cutting tool insert, comprising a cemented carbide body and a coating,
wherein the cemented carbide body comprises:
WC,
about 4.5-6.5 wt-% Co; and
about 3-10 wt-% of at least one cubic carbide forming metal selected from the group consisting of groups IVb, Vb and VIb of the periodic table;
wherein the cemented carbide body has an S-value of about 0.77-0.92 and a coercivity of about 10-20 kA/m adjacent;
wherein the coating comprises an uppermost layer,
wherein the uppermost layer is about 7-12 μm thick;
wherein the uppermost layer comprises an α-Al$_2$O$_3$ layer textured in the <006>-directions with a texture coefficient TC(006) greater than about 2, TC(012), TC(110), TC(113), TC(202), TC(024) and TC(116) are simultaneously all less than about 1, and TC(104) being the second highest texture coefficient, the texture coefficient TC(hkl) being defined by:

$$TC(hkl) = \frac{I(hkl)}{I_0(hkl)} \left[ \frac{1}{n} \sum_{n=1}^{n} \frac{I(hkl)}{I_0(hkl)} \right]^{-1}$$

where
I(hkl)=measured intensity of the (hkl) reflection;
Io(hkl)=standard intensity according to JCPDS card no 46-1212;
n=number of reflections used in the calculation (8);
(hkl) reflections used are: (012), (104), (110), (006), (113), (202), (024) and (116).

2. The cutting tool insert according to claim 1,
wherein TC(104) is less than about 2 and greater than about 0.5.

3. The cutting tool insert according to claim 1,
wherein the cemented carbide body comprises about 5-6 wt-% Co.

4. The cutting tool insert according to claim 1,
wherein the cemented carbide body has an S-value of about 0.79-0.89.

5. The cutting tool insert according to claim 1,
wherein the coercivity is about 13-17 kA/m adjacent.

6. The cutting tool insert according to claim 1,
wherein the uppermost layer is about 8-11 μm thick.

7. The cutting tool insert according to claim 1,
wherein the texture coefficient TC(006) is greater than about 3 and less than about 6.

8. The cutting tool insert according to claim 1,
wherein the cemented carbide body comprises about 6-10 wt-% cubic carbide forming metal selected from the group consisting of groups IVb, Vb and VIb of the periodic table.

9. The cutting tool insert according to claim 1,
wherein the cemented carbide body comprises about 7-8 wt-% cubic carbide forming metal selected from the group consisting of groups IVb, Vb and VIb of the periodic table.

10. The cutting tool insert according to claim 1,
wherein the cemented carbide comprises about 3-6 wt-% cubic carbide forming metal selected from the group consisting of groups IVb, Vb and VIb of the periodic table.

11. The cutting tool insert according to claim 1,
wherein the cemented carbide body comprises about 3-5 wt-% cubic carbide forming metal selected from the group consisting of groups IVb, Vb and VIb of the periodic table.

12. The cutting tool insert according to claim 1,
wherein the cubic carbide forming metal is Ti, Nb, Ta, or a combination thereof.

13. The cutting tool insert according to claim 12,
wherein the ratio between the weight concentrations of Ta and Nb is about 1.0-3.0, and the ratio between the weight concentrations of Ti and Nb is about 0.5-1.5.

14. The cutting tool insert according to claim 12,
wherein the ratio between the weight concentrations of Ta and Nb is about 1.5-2.5, and the ratio between the weight concentrations of Ti and Nb is about 0.8-1.2.

15. The cutting tool insert according to claim 1,
wherein at least one surface of the cemented carbide body comprises a binder phase enriched surface zone, wherein the binder phase enriched surface zone has a thickness of about 5-40 μm, and is essentially free from cubic carbides.

16. The cutting tool insert according to claim 15,
wherein the binder phase enriched surface zone has a thickness of about 5-30 μm.

17. The cutting tool insert according to claim 15,
wherein the binder phase enriched surface zone has a thickness of about 10-25 μm.

18. The cutting tool insert according to claim 1,
wherein the coating further comprises a first layer adjacent the cemented carbide substrate having a thickness of about 4-12 μm, where the first layer comprises at least one material selected from the group consisting of MTCVD Ti(C,N), MTCVD Ti(C,O,N), CVD Ti(C,N), CVD TiN, CVD TiC, MTCVD Zr(C,N), and combinations thereof.

19. The cutting tool insert according to claim 18, wherein the first layer has a thickness of about 5-10 μm.

20. The cutting tool insert according to claim 18, wherein the first layer comprises MTCVD Ti(C,N), wherein MTCVC Ti(C,N) is in a form of columnar grains.

21. The cutting tool insert according to claim 1, wherein the α-$Al_2O_3$ layer comprises columnar grains having a length/width ratio of about 2-12.

22. The cutting tool insert according to claim 1, wherein the α-$Al_2O_3$ layer comprises columnar grains having a length/width ratio of about 4-8.

23. The cutting tool insert according to claim 1, wherein the α-$Al_2O_3$ layer is the uppermost layer and has an $R_a$ value of less then about 1.0 μm.

* * * * *